United States Patent [19]

Oktay et al.

[11] 4,203,129
[45] May 13, 1980

[54] BUBBLE GENERATING TUNNELS FOR COOLING SEMICONDUCTOR DEVICES

[75] Inventors: Sevgin Oktay, Poughkeepsie; Gerard J. Torgersen, Pawling; Alexander C. Wong, Wappingers Falls, all of N.Y.

[73] Assignee: International Business Machines Corporation, Armonk, N.Y.

[21] Appl. No.: 923,592

[22] Filed: Jul. 11, 1978

[51] Int. Cl.² ............... H01L 25/04; H01L 39/02
[52] U.S. Cl. ................... 357/82; 357/80; 165/80 C; 165/105; 174/16 HS
[58] Field of Search ............... 357/82, 80; 165/80, 165/105; 174/16

[56] References Cited

U.S. PATENT DOCUMENTS

| | | | |
|---|---|---|---|
| 3,790,859 | 2/1974 | Schraeder | 357/82 |
| 3,972,063 | 7/1976 | Kimura et al. | 357/82 |
| 4,027,728 | 6/1977 | Kobayashi | 357/82 |
| 4,028,783 | 6/1977 | Shikano et al. | 357/82 |
| 4,036,291 | 7/1977 | Kobayashi et al. | 357/82 |
| 4,045,245 | 8/1977 | Coleman et al. | 357/82 |
| 4,138,692 | 2/1979 | Meeker et al. | 357/82 |

OTHER PUBLICATIONS

IBM Technical Disclosure Bulletin; Promoting Nucleate Boiling of Semiconductors Devices in a Fluorocarbon Coolant; by Alcorn; vol. 20, No. 4, Sep. 1977, p. 1395.

*Primary Examiner*—Andrew J. James
*Attorney, Agent, or Firm*—George O. Saile

[57] ABSTRACT

A structure for cooling high density integrated circuit devices composed of a heat sink bonded to the backside of the integrated circuit devices. The integrated circuit devices are mounted on a board and the board positioned so that the tunnels in the heat sink are oriented vertically. The tunnels are totally immersed in a liquid so that the integrated circuit devices are cooled by nucleate boiling and bubbles form within the tunnels and propagate out of the tunnels.

28 Claims, 10 Drawing Figures

BUBBLE GENERATING TUNNELS FOR COOLING SEMICONDUCTOR DEVICES

DESCRIPTION

Technical Field

This invention relates to cooling of electronic devices, and more particularly to a structure which is effective for cooling large scale integrated semiconductor devices.

Background Art

The large scale integration of electronic circuits in small bodies of silicon has caused increasing problems in the dissipation of heat within the body of silicon. One of the most attractive of the methods for removing heat from these bodies of silicon is through the immersion cooling system. In this system semiconductor devices are immersed in a cooling liquid. The liquid used is dielectric and typically has a low-boiling point. The liquid boils at the surface of the device and thereby cools the device. The heat is then removed from the liquid.

The heating process for convection to nucleate boiling is understood as follows. When the device is heated slightly above the temperature of the liquid, temperature gradients are set up between the part of liquid immediately adjacent to the device and the remaining bulk, inducing buoyancy driven natural convection. Natural convection prevails until the device reaches a temperature sufficiently above the boiling point of the liquid to initiate bubble growth on the surface. The amount of superheat required for the onset of nucleate boiling depends on the nucleation characteristics of the surface. The bubble growth and detachment processes results in vigorous agitation in the boundary layer, giving rise to a marked improvement in heat transfer. As heat dissipation to the device is further increased, more bubble columns are formed and eventually they start interfering with each other. The onset of film boiling marks the upper limit of nucleate boiling where interaction of bubbles causes a vapor film to form on the heated surface, thus restricting liquid supply to the surface.

Semiconductor devices of various types have been cooled by the flow of liquid coolant through coolant ducts, or the like. These types of devices have been in the past typically thyristers, lasers, light emitting diodes, and the like, such as shown in E. G. Dierschke, U.S. Pat. No. 3,711,789, E. Weidemann, U.S. Pat. No. 3,784,885, A. Marek, U.S. Pat. No. 3,771,027 and D. B. Kay, U.S. Pat. No. 3,771,031. These cooling techniques simply use convection cooling, and do not allow the liquid to reach boiling temperatures.

R. C. Chu, et al U.S. Pat. No. 3,512,582, N. K. G. Aakalu, et al U.S. Pat. No. 3,741,292 and R. C. Chu, et al, U.S. Pat. No. 4,050,507 describe nucleate boiling heat transfer methods and arrangements. In each of these patents modules having heat generating components, such as semiconductor devices, are located within a low boiling point dielectric liquid. A vapor space is located above the liquid level. The electronic components heat the liquid causing nucleate boiling at the surface of the electronic components. The R. C. Chu, et al U.S. Pat. No. 4,050,507 describe electronic chips having nucleate boiling sites located on at least the back surface of the chip and mounted so that the back surface is exposed and is oriented vertically.

Another type of cooling structure is described in R. C. Chu, et al U.S. Pat. No. 3,993,123 and IMB TDB, Vol. 20, No. 11A, April, 1978, pages 4334 and 4335, entitled, "Conduction Cooling Module", by U. P. Hwang, et al, utilize heat conductive elements which may be in the shape of pistons urged against the heat generating electronic devices. Surrounding the heat generating devices and pistons is a gas, such as helium, or a liquid which improves heat transfer between the electronic devices and the pistons.

One of the major problems encountered in liquid immersion cooling of high-powered semiconductor devices is the film boiling. Although it is known that increased heat transfer areas, such as provided by heat sinks attached to the heat dissipating surface will help increase heat transfer rates, heat sinks are not necessarily effective in retarding film boiling. A specific heat sink that provides large increase in surface area and can be used for all modes of heat transfer, including nucleate boiling, is dendrites as described in IBM TDB Vol. 20, No. 6, November, 1977, page 2218, entitled, "Dendrite Conduction Module", by S. Oktay, et al.

SUMMARY OF THE PRESENT INVENTION

In accordance with the present invention, a liquid encapsulated module structure is described which includes at least one heat generating semiconductor device on a substrate. A container attached to the substrate is in sealed relationship such that the substrate forms a vertical sidewall to the inside of the container. A heat sink composed of a heat conducting body having a plurality of vertically oriented tunnels therein is formed on one side of the heat generating semiconductor device. The container is substantially, but not completely, filled with a low boiling point liquid which completely covering the heat generating device. Means are also provided for removing heat from the liquid. The tunnels are totally immersed in the liquid so that during the heating of the semiconductor device due to its electrical operation bubbles form within the tunnels and propagate upward and out of the tunnels to promote cooling of the semiconductor device.

The semiconductor device is physically and electrically connected by metal connections to the substrate. The integrated circuit structures in the semiconductor device are formed on the side where the metal connections are made to the substrate, and therefore the substrate must be spaced by these metal connections from the semiconductor device to prevent shorting. The vertically oriented tunnels may be formed between the metal connections or alternatively on the back surface of the semiconductor device away from the substrate.

DISCLOSURE OF THE INVENTION

Figure 1A:
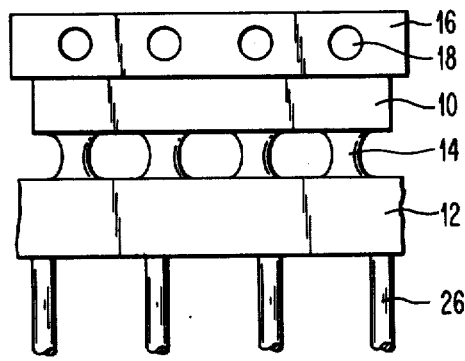
FIGS. 1A and 1B—Show forms of the invention wherein the tunnels are located on the back of the semiconductor device.

Referring now to FIG. 1A there is shown a large scale integrated semiconductor device 10. The semiconductor device 10 is attached to a substrate 12, both physically and electrically, by metal connections 14 which space the semiconductor device from the substrate. A thermally conductive material (not shown) may be located within the space between the semiconductor device 10 and the substrate 12. A heat sink 16 is bonded on the back side of the semiconductor device 10 away from the substrate 12. This heat sink contains tunnels or holes therein. Any suitable bonding technique may be used to attach the heat sink 16 to the semiconductor device 10. Examples of the bonding techniques are gold-silicon eutectic bonding, chromium-copper layer on the device with indium solder bonding, thermal grease bonding and dry pressured contact.

Figure 1B:
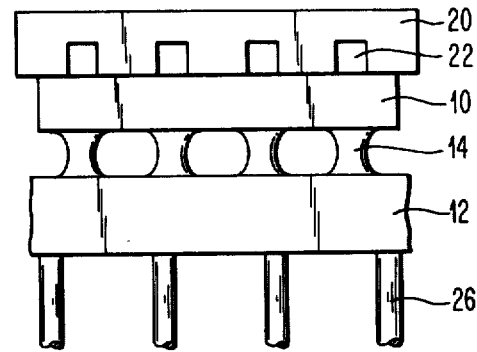

FIG. 1B shows a modification of the tunneled heat sink on the back side of the semiconductor chip 10. In this embodiment, the heat sink 20 has channels 22 formed therein on its surface. When the heat sink 20 is bonded to the semiconductor device the channels form the tunnels with the back side of the semiconductor device 10. Bonding is accomplished by any suitable bonding technique. Any of the bonding examples given in the proceding paragraph may be used. Care is required to avoid filling these channels during the bonding step.

Figure 2:
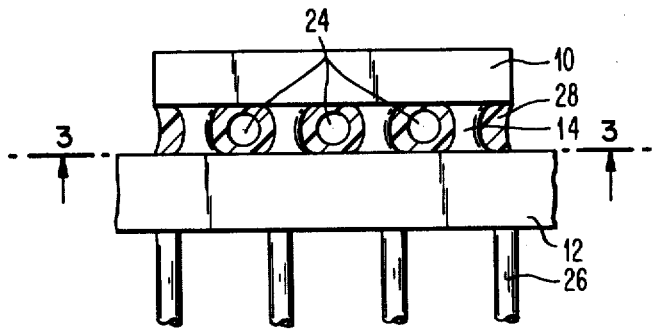
FIGS. 2 and 3—Show a second form of the invention wherein the tunnels are located on the substrate side of the semiconductor device.
Figure 3:
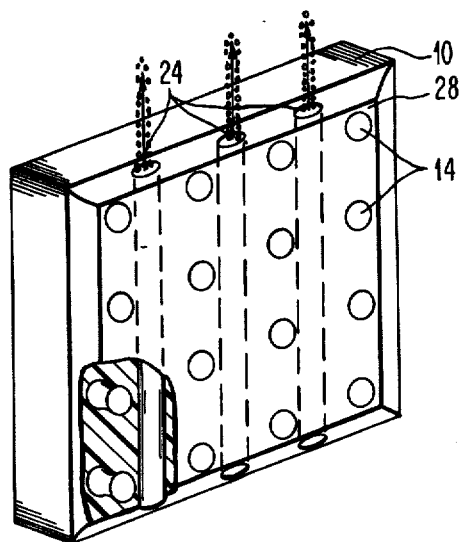

FIGS. 2 and 3 illustrate another embodiment for the tunnels 24 wherein the tunnels 24 are formed between the semiconductor device 10 and the substrate 12. Input, output pins 26 are indicated as extending from substrate 12 in FIG. 2.

The tunnels 24 may be formed by placing small diameter fibers of the order of 0.1 millimeters between the metal contacts 14 of the semiconductor chip 10. A suitable wax, such as microcrystalline wax, is dispensed under the chip, the fibers are pulled out after curing of the wax. It is preferred that this waxing process is performed at the wafer level before dicing of the semiconductor chips from the wafer, and that the fibers are pulled out after the semiconductor chip 10 is joined to the substrate 12 by means of the metal connections 14. The tunnels 24 so formed in between the metal connections serve as "chimneys" through which bubble nucleation growth is enhanced, and hence high heat transfer coefficients are achieved as illustrated in FIG. 3. The tunnels 24 must be continuous and oriented vertically under the chip during the cooling operation.

Figure 4:
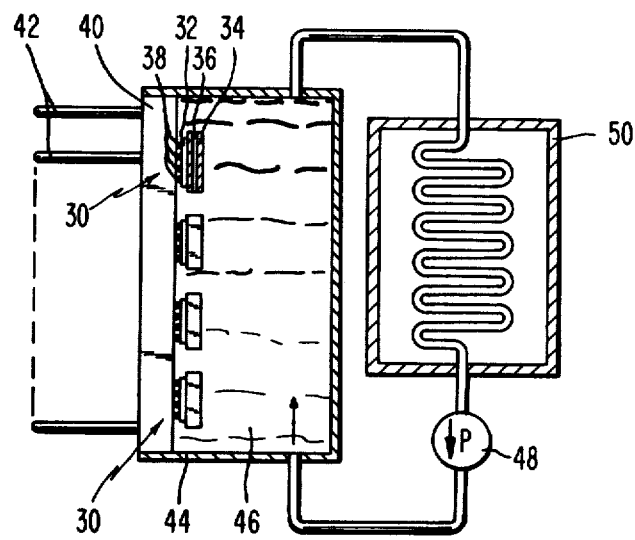
FIGS. 4 and 5—Illustrate systems for cooling semiconductor devices.

FIG. 4 illustrates one form of a liquid encapsulated module system for cooling high density integrated circuit devices. The schematic illustration shows four high density integrated circuit devices 30. The number of devices, of course, could be expanded to hundreds, or more. The devices include a semiconductor chip 32 and a heat sink 34 containing tunnels 36 bonded to the back side of chip 32. Metal connections 38 for physically and electrically connecting the integrated circuit devices to the substrate 40 are shown. The substrate has input, output pins 42 which connect the semiconductor integrated circuits in the device 32 with other electronic systems. A vessel or container 44 contains a cooling liquid 46. The contents of container 44 is maintained under an essentially constant pressure. The liquid 46 is a low boiling point and dielectric liquid, such as one of the fluorocarbons, for example, perfluoro-n-hexane. The constant pressure in the vessel or the container 44 maintains the boiling point at a fixed temperature. The liquid 46 moves through the container 44, partially vaporizes by heat from the semiconductor devices, and the vapor is liquified and liquid cooled by heat exchanger structure 50. A pump 48 may be placed between the heat exchanger 50, and the container 44 to facilitate return of cooling liquid 46 to the container 44.

Figure 5:
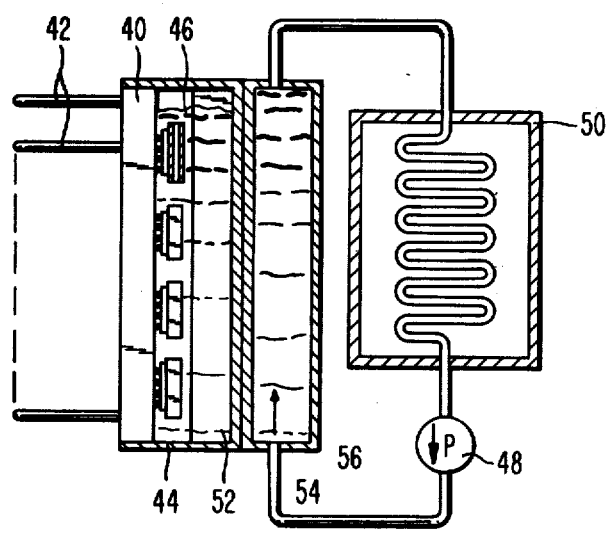

FIG. 5 shows a second embodiment of the cooling system for high density integrated circuit devices. It is a similar structure to that of FIG. 4 in regard to the substrate and mounting for the semiconductor integrated circuit chips. Therefore, like numbers indicate like structures. FIG. 5 differs from FIG. 4 structure in its means for removing heat from the cooling system. A suitable secondary cooling liquid 54, such as water, moves through cold plate 56 which is in contact with heat conducting fins structure 52 and carrier heat away from the fins 52 to the heat exchanger 50. Within container 44 heat is transferred from the tunnels 24 to the boiling liquid 45 and then to the fin structure 52.

Figure 6:
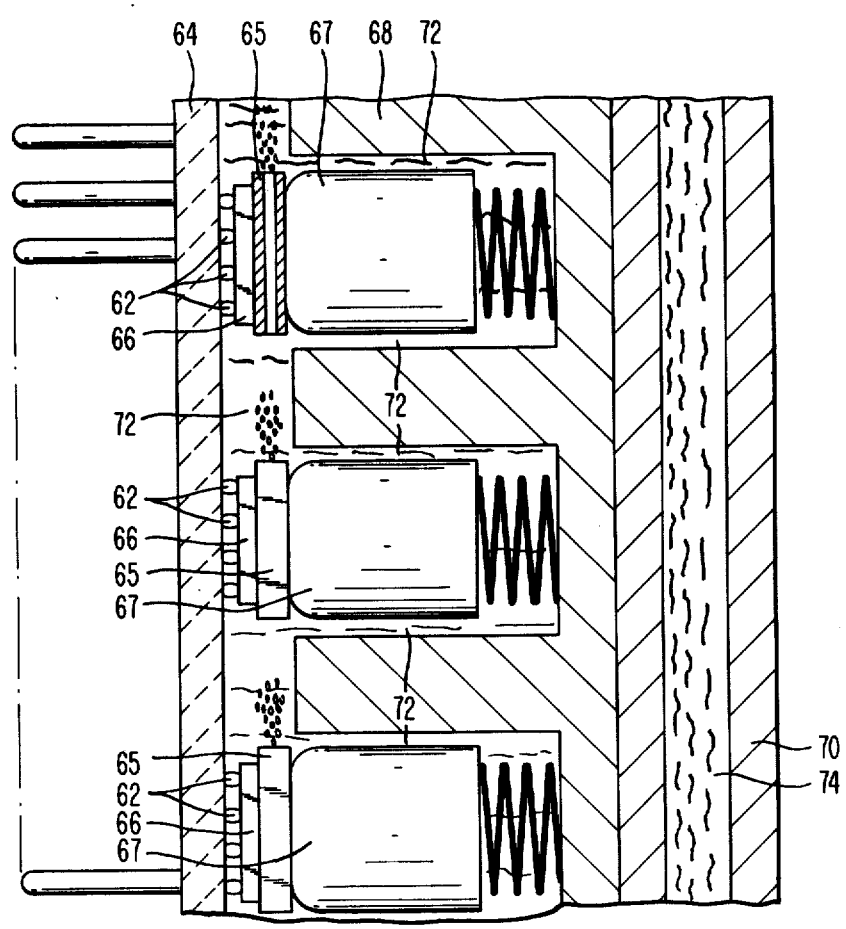
FIG. 6—Illustrates another form of the invention which utilizes both nucleate boiling and conduction through a heat conducting member for cooling the semiconductor devices.

FIG. 6 illustrates another embodiment wherein both immersion cooling and conduction cooling are utilized. Semiconductor chips 66 are mounted on substrate 64 by means of metal contacts 62. A heat sink 65 is bonded on the back side of the semiconductor device 66. The heat sink contains the tunnels that were described in conjunction with the earlier Figures, such as 1A, 1B, 2 and 3. The structure is oriented vertically so that the tunnels act as "chimneys" for the bubbles to rise through them. A spring loaded heat-conducting piston 67 also acts to cool the integrated circuit devices 66 by conduction heat transfer. The pistons 67 are seated in the module housing 68. The pistons 67 are cooled by an attached cold plate 70 which has circulating fluid 74 therethrough. The spring-loaded pistons 67 may be crowned as shown or be substantially flat. The crown surface of the piston tip provides the assurance of a satisfactory contact between the back side heat sink 65 and the piston 67. The module housing 68 is filled with a fluid 72 up to a level which does not quite fill the housing. The fluid acts to improve heat transfer between the semiconductor devices 66 and the pistons 67. The fluid may be, for example, perfluoro-n-hexane.

The heat sink containing the tunnels can be formed of any thermal conductive metal or other material such as, for example, copper, silicon, molybdenum, etc. The holes or tunnels, preferably has an aspect ratio, L/D, where D is the diameter and L the length of the hole, of between about 4 to 7 in the case of FIGS. 1A and 1B embodiment. In the case of the FIGS. 2, 3 embodiment, the aspect ratio is about 30 to 70 because of the spacing limitation between the device 10 and substrate 12. The holes or tunnels may be of other shapes than circular.

The following examples are included merely to aid in the understanding of the invention, and variations may be made by one skilled in the art without departing from the spirit and scope of the invention.

EXAMPLE 1

Figure 7:
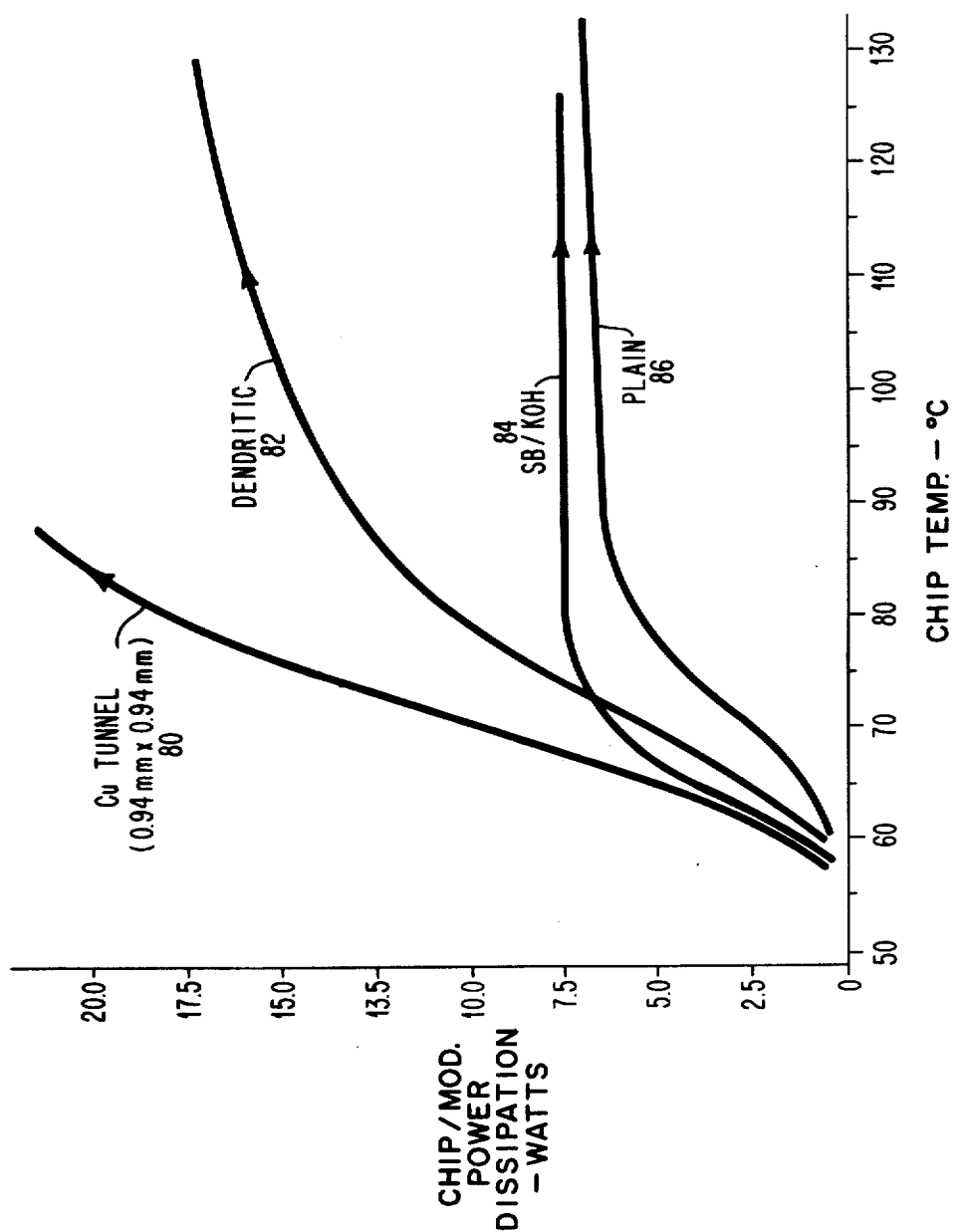
FIG. 7—Shows the power dissipation versus semiconductor chip temperature wherein several cooling systems are utilized.

Boiling experiments were performed with vertically oriented tunnels on the back of a 4.6 mm × 4.6 mm silicon device which was mounted on a 25 mm × 25 mm substrate as shown in FIG. 1A. The heat sink was made of copper and measured 6.0 mm × 6.0 mm × 1.5 mm with four 1 mm diameter circular tunnels. The interface between the silicon device and the heat sink was of the dry pressured contact type effected by two drops of silver epoxy positioned between the edge of the heat sink and the substrate and cured under a dead weight of 40 grams. The tunnels-chip-substrate assembly was then placed in a vessel which was filled with perfluoro-n-hexane. The complete vessel assembly was heated to 54° C. by a built-in heat exchanger and then sealed off. All experiments were performed within the sealed vessel under roughly constant pressure of 1 atmosphere by matching the heat exchanger capacity with the heat dissipating load of the device. Forward biased diodes in the silicon chip served as temperature sensors, and their voltage-temperature relationship was established prior to the test runs. Curve 80 in FIG. 7 shows the tunnel heat sink performance, where the ordinate depicts total chip/module power dissipation in watts, and the abscissa the chip temperature in degrees Celsius. As a comparison, experiments were also carried out with a nickel-iron dendritic chip (See Oktay, U.S. Pat. No. 3,706,127), with a sand-blasted and subsequently KOH etched chip and with an untreated plain chip. These results are depicted in curves 82, 84 and 86, respectively in FIG. 7. It is demonstrated from FIG. 7 that with the application of copper tunnel heat sink, chip/module power dissipation goes beyond 20 watts without getting into film boiling, a clear advantage over the other cooling systems.

EXAMPLE 2

Figure 8:
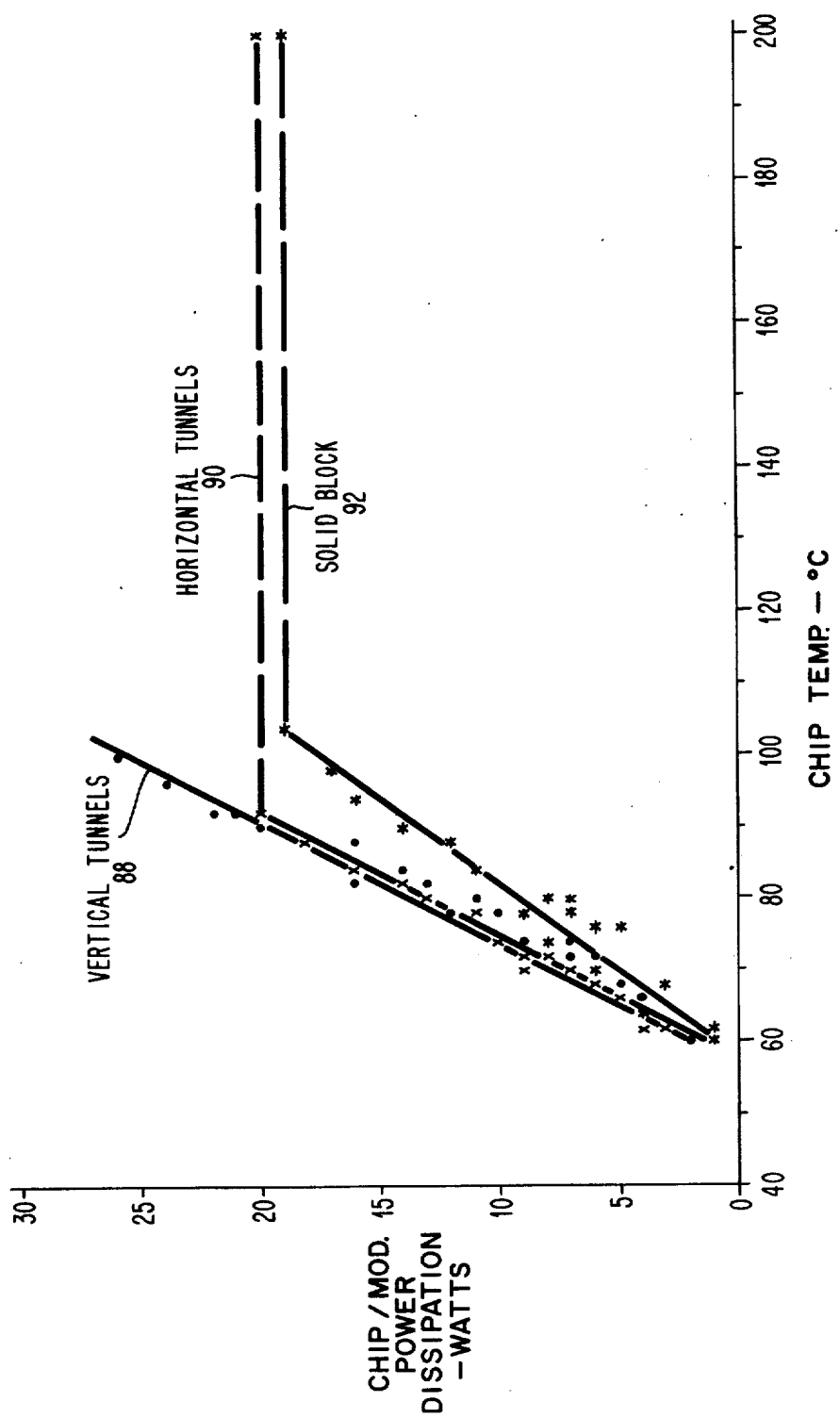
FIG. 8—Shows power dissipation versus semiconductor chip temperature where various types of heat sinks are utilized.

To illustrate that the resistance to film boiling as evidenced by curve 80 of FIG. 7 is not a mere result of added heat transfer surfaces, but rather a unique feature of the vertical tunnels, experiments with vertically, as well as horizontally oriented tunnels were performed under otherwise identical test conditions. The experiments were constructed and carried out as described in Example 1. The results are shown in FIG. 8 where curve 88 is vertical tunnel heat sink, curve 90 is horizontal tunnel heat sink, and curve 92 a solid heat sink. For comparison, test results of a heat sink consisting of a solid copper block with identical dimensions are also included. It is clearly demonstrated that a horizontal tunnel performs similarly to a solid block in that they both show no resistance to onset of film boiling.

EXAMPLE 3

Figure 9:
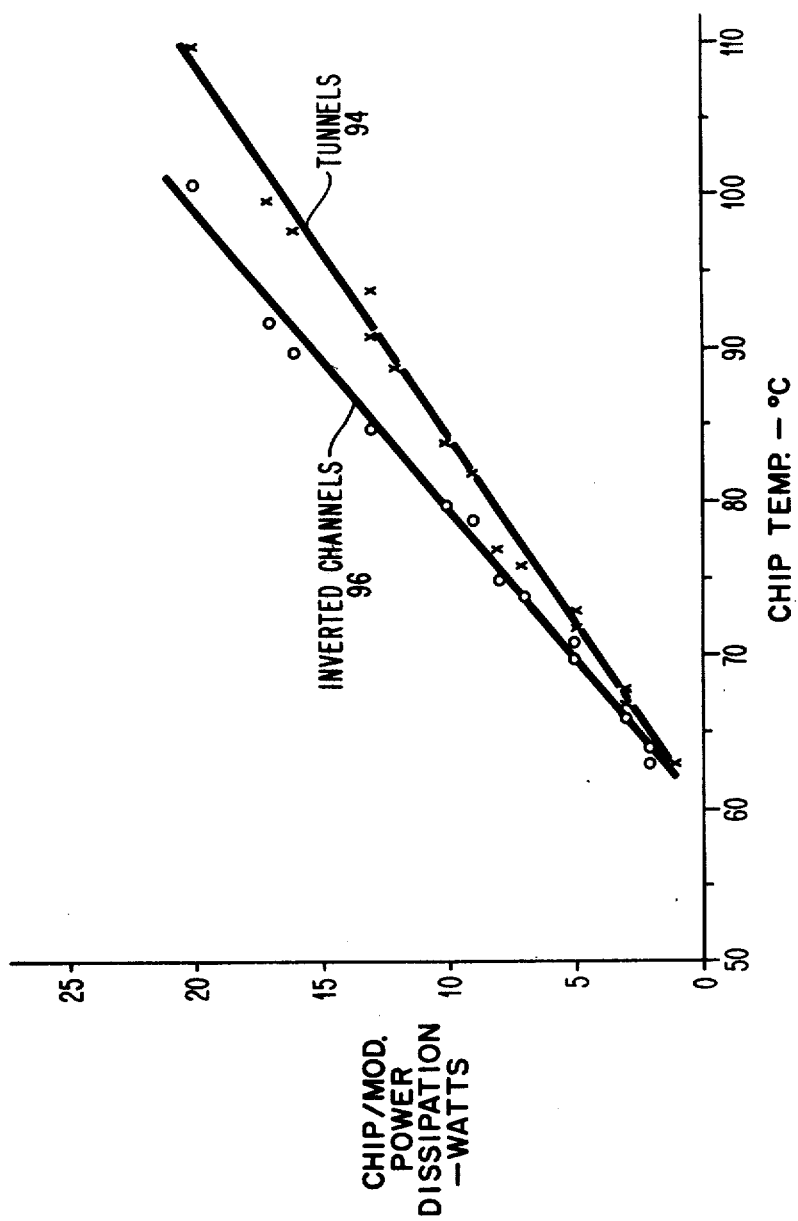
FIG. 9—Shows power dissipation versus chip temperature for two types of vertically oriented tunnels type cooling structure.

FIG. 9 delineates the comparable heat transfer performance of two types of tunnels arrangements, as shown in FIG. 1A and FIG. 1B, wherein curve 94 is FIG. 1A, and curve 96 is FIG. 1B.

While the invention has been particularly described with reference to the preferred embodiments thereof, it would be understood by those skilled in the art that the foregoing and other changes in form and details may be made therein without departing from the spirit and scope of the invention.

Having thus described our invention, what we claim as new, and desire to secure by Letters Patent is:

1. A liquid encapsulated module comprising:
    a plurality of heat generating devices on a substrate;
    a container attached to said substrate in sealed relationship such that the substrate forms a vertical side wall to the inside of said container;
    a heat sink composed of a heat conducting body having a plurality of vertically oriented tunnels therein formed on one side of said heat generating components;
    a low boiling point liquid partially filling said container and completely covering said heat generating components;
    a vapor space above the liquid surface level;
    said tunnels being of such dimension so as to provide enhanced bubble nucleation growth and the movement of bubbles upward and out of the tunnels to promote cooling of said devices; and
    means for removing heat from the said container.

2. The module of claim 1 wherein said heat generating devices are integrated circuits.

3. The module of claim 1 wherein the said devices are physically and electrically connected to said substrate by metal connections which space the said devices from the said substrate.

4. The module of claim 3 wherein said heat sink is a heat conductive wax located within the space between the said devices and substrate and said vertically oriented tunnels are formed within the wax.

5. The module of claim 3 wherein said heat sink is a heat conductive member bonded to the side of the said devices opposite to that of said substrate and having said tunnels therein.

6. The module of claim 3 wherein said heat sink includes a heat conductive wax located within the space between the said devices and substrate and vertically oriented tunnels are formed within the wax, and a heat conductive member bonded to the side of the said devices opposite to that of said substrate and having tunnels therein.

7. The module of claim 5 wherein said tunnels have a circular cross-section.

8. The module of claim 5 wherein the heat sink is composed of silicon.

9. The module of claim 5 wherein said heat sink is composed of copper.

10. The module of claim 1 wherein said liquid is a fluorocarbon dielectric liquid.

11. The module of claim 1 further comprising means held at least closely adjacent to the side of each of said devices to remove heat from said devices by conduction as well as by nucleate boiling.

12. The module of claim 4 further comprising means held contiguous to the side of each of said devices to remove heat from said devices by conduction as well as by nucleate boiling.

13. The module of claim 5 further comprising means held contiguous to the side of said heat sinks opposite to that of the said devices to remove heat from said devices by conduction as well as by nucleate boiling.

14. The module of claims 11, 12 or 13 wherein said means to remove heat by conduction includes a spring-loaded piston.

15. The module of claim 1 wherein the vapor produced from said liquid is circulated through said means for removing heat.

16. The module of claim 1 wherein said means for removing heat is a liquid cooling jacket attached to the side of said container opposite to that of said substrate.

17. The module of claim 1 wherein said tunnels have an aspect ratio, L/D, of 4 to 7.

18. A cooling system for high density integrated circuit devices comprising:

a heat sink composed of a heat conductive body having a plurality of tunnels therein bonded to the back side of each said high density integrated circuit device;

said devices are mounted upon a substrate;

the said substrate is so positioned in said system that said tunnels in the back side of said chips are substantially vertically oriented; and means for totally immersing the said heat sink having said tunnels in a liquid to promote and augment boiling of said liquid within and through said tunnels to thereby cool said devices.

19. The cooling system of claim 18 wherein said tunnels have a circular cross-section.

20. The cooling system of claim 19 wherein said tunnels have an aspect ratio, L/D, of 4 to 7.

21. The cooling system of claim 18 wherein said liquid is a fluorocarbon dielectric liquid.

22. The cooling system of claim 18 and further comprising means for removing heat from said system which includes circulation of a two-phase mixture produced from said liquid through a heat exchanger.

23. The cooling system of claim 18 and further comprising means for removing heat from said system which includes a liquid cooling jacket attached to said system.

24. The cooling system of claim 18 wherein said devices are physically and electrically connected to the said substrate by metal connections which space the said devices from the said substrate.

25. A cooling system for high density integrated circuit devices comprising:

a substrate for mounting said devices;

said devices are physically and electrically connected to said substrate by metal connections which space the said devices from said substrate;

heat sink means composed of a heat conducting wax located within the space between the said devices and substrate and vertically oriented tunnels formed within the wax;

the said substrate is so positioned in said system that said tunnels are substantially vertically oriented; and means for totally immersing the said heat sink means having said tunnels in a liquid to promote and augment boiling of said liquid within and through said tunnels to thereby cool said devices.

26. The cooling system of claim 25 and further comprising:

means for removing heat from said system which includes circulation of a two-phase mixture produced from said liquid through a heat exchanger.

27. The cooling system of claim 25 and further comprising:

a second heat sink means bonded to the side of the said devices opposite to that of said substrate and having tunnels therein oriented parallel in length with said tunnels within said wax.

28. The cooling system of claim 25 or 27 wherein said tunnels have an aspect ratio, L/D, of 30 to 70.

* * * * *